United States Patent
Bakker et al.

(10) Patent No.: US 6,859,259 B2
(45) Date of Patent: Feb. 22, 2005

(54) LITHOGRAPHIC PROJECTION APPARATUS AND REFLECTOR ASSEMBLY FOR USE THEREIN

(75) Inventors: Levinus Pieter Bakker, Helmond (NL); Jeroen Jonkers, Aachen (DE); Frank Jeroen Pieter Schuurmans, Valkenswaard (NL); Hugó Matthieu Visser, Utrecht (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/639,753

(22) Filed: Aug. 13, 2003

(65) Prior Publication Data
US 2004/0109151 A1 Jun. 10, 2004

(30) Foreign Application Priority Data
Aug. 15, 2002 (EP) ............................. 02078390

(51) Int. Cl.[7] ............................. G03B 27/42
(52) U.S. Cl. ................ 355/53; 67/71; 378/85; 250/504 R
(58) Field of Search ............. 355/53, 67, 71; 378/85; 250/492.1, 504 R

(56) References Cited

U.S. PATENT DOCUMENTS

| 6,064,072 A | 5/2000 | Partlo et al. ............. 250/504 R |
| 6,285,737 B1 | 9/2001 | Sweatt et al. ................. 378/34 |
| 2003/0095623 A1 | 5/2003 | Singer et al. ................. 378/85 |

FOREIGN PATENT DOCUMENTS

| DE | 101 38 284 A1 | 2/2003 |
| EP | 1 211 918 A1 | 6/2002 |

*Primary Examiner*—D. Rutledge
(74) *Attorney, Agent, or Firm*—Pillsbury Winthrop LLP

(57) ABSTRACT

A lithographic projection apparatus includes a radiation system configured to form a beam of radiation from radiation emitted by a radiation source, as well as a support configured to hold a patterning device, which when irradiated by the beam provides the beam with a pattern. A substrate table is configured to hold a substrate, and a projection system is configured to image an irradiated portion of the patterning device onto a target portion of the substrate. The radiation system further includes an aperture at a distance from the optical axis, a reflector which is placed behind the aperture when seen from the source and a structure placed in a low radiation intensive region behind the aperture.

23 Claims, 6 Drawing Sheets

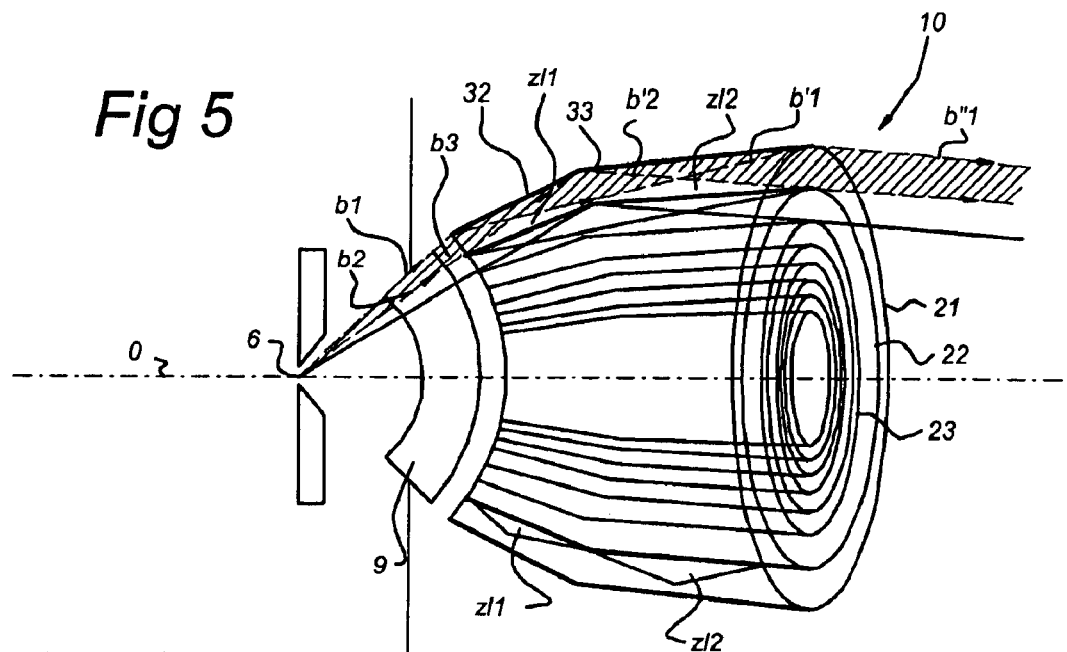
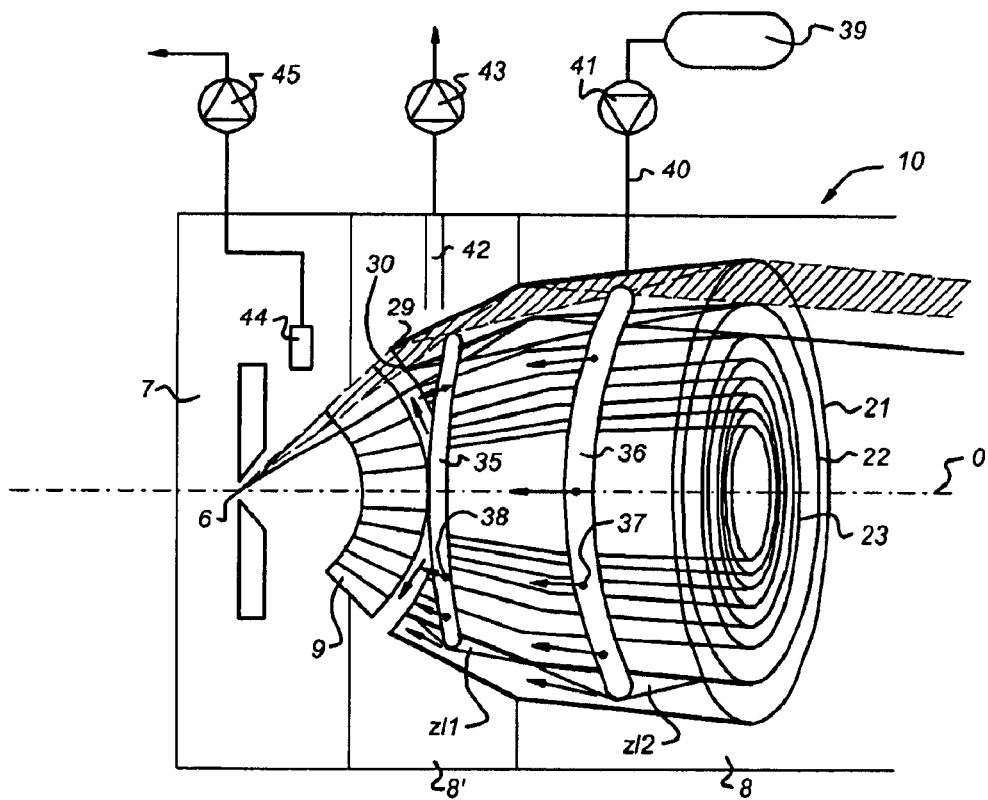

LITHOGRAPHIC PROJECTION APPARATUS AND REFLECTOR ASSEMBLY FOR USE THEREIN

This application claims priority to European Application 02073390.8, filed Aug. 15, 2002, the entire contents of which are incorporated herein by reference.

BACKGROUND OF THE INVENTION

1. Field of the Invention

The present invention relates to a lithographic projection apparatus and a reflector assembly for use therein.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

In a lithographic apparatus the size of features that can be imagined onto the substrate is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation in the range 5 to 20 nm, especially around 13 nm. Such radiation is termed extreme ultraviolet (EUV) or soft x-ray and possible sources include, for example, laser-produced plasma sources, discharge plasma sources, or synchrotron radiation from electron storage rings. Apparatus using discharge plasma sources are described in: W. Partlo, I. Fomenkov, R. Oliver, D. Birx, "Development of an EUV (13.5 nm) Light Source Employing a Dense Plasma Focus in Lithium Vapor", Proc. SPIE 3997, pp. 136–156 (2000); M. W. McGeoch, "Power Scaling of a Z-pinch Extreme Ultraviolet Source", Proc. SPIE 3997, pp. 861–866 (2000); W. T. Silfvast, M. Klosner, G. Shimkaveg, H. Bender, G. Kubiak, N. Fomaciari, "High-Power Plasma Discharge Source at 13.5 and 11.4 nm for EUV lithography", Proc. SPIE 3676, pp. 272–275 (1999); and K. Bergmann et al., "Highly Repetitive, Extreme Ultraviolet Radiation Source Based on a Gas-Discharge Plasma", Applied Optics, Vol. 38, pp. 5413–5417 (1999).

EUV radiation sources may require the use of a rather high partial pressure of a gas or vapor to emit EUV radiation, such as discharge plasma radiation sources referred to above. In a discharge plasma source, for instance, a discharge is created in between electrodes, and a resulting partially ionized plasma may subsequently be caused to collapse to yield a very hot plasma that emits radiation in the EUV range. The very hot plasma is quite often created in Xe, since a Xe plasma radiates in the extreme UV (EUV) range around 13.5 nm. For an efficient EUV production, a typical pressure of 0.1 mbar is required near the electrodes to the radiation source. A drawback of having such a rather high Xe pressure is that Xe gas absorbs EUV radiation. For example, 0.1 mbar Xe transmits over 1 m only 0.3% EUV radiation having a wavelength of 13.5 nm. It is therefore required to confine the rather high Xe pressure to a limited region around the source. To achieve this, the source can be contained in its own vacuum chamber that is separated by a chamber wall from a subsequent vacuum chamber in which the collector mirror and illumination optics may be obtained.

The use of plasma sources for generating EUV radiation results in photons and (charged) particles being emitted, so-called "debris", which particles can result in a degradation of the optical components in the lithography apparatus, in particular of the illumination system. It was found that a sufficiently high gas pressure in front of the source will reduce the problem with the debris emitted from the source, but results in a drawback of too high a gas flow into the lithography system and into the EUV source.

For providing EUV transparency in the illumination system, the pressure in the optical system of the illuminator is maintained relatively low, for instance at $\frac{1}{1000}$ of the pressure of the radiation source, which may comprise Xe at a source pressure of 0.1 mbar. U.S. Patent Application Publication 2002/0136939 A1 and U.S. Pat. No. 6,359,969 propose a so called foil trap structure in proximity to the source to block debris and/or to generate a pressure drop between a source chamber and an optics chamber without substantially blocking the EUV radiation path.

In the optics closer to the source, part of the incident radiation is absorbed, resulting in significant heating of the optical elements. A heating profile may result with reduced temperatures further along the optical axis result. For stable and accurate operation, cooling of the optical components is necessary and a homogeneous temperature distribution is favorable for reducing temperature induced displacements in the optical system.

The optical elements in proximity to the source need to be supported in the EUV radiation beam using support structures at a position that prevents significant obstruction of the EUV transmission characteristics.

SUMMARY OF THE INVENTION

It is therefore an aspect of the present invention to provide a lithographic projection apparatus having a debris suppression system which has relatively little impact on EUV transparency.

It is another aspect of the present invention to provide a lithographic projection apparatus with an illumination system comprising structural components which do not serve the purpose of imaging, that are placed in the EUV beam while causing relatively little EUV absorption.

It is another aspect of the present invention to provide a lithographic projection apparatus having an optical component in the vicinity of the source which results in a relatively large pressure drop along the optical axis without substantially causing absorption of EUV radiation.

It is another aspect of the present invention to provide a lithographic projection apparatus having an optical component comprising a heat transfer device attached to the optical component generally within the EUV ray path without causing substantial EUV absorption.

It is a further aspect of the present invention to provide a lithographic projection apparatus having an assembly of optical components which are interconnected by support structures generally extending in the EUV beam without causing substantial EUV absorption.

It is a further aspect of the present invention to provide a lithographic projection apparatus with optical components near the source, which may be provided with a heat transfer device according to a temperature profile, without causing substantial EUV absorption.

It is yet another aspect of the present invention to provide a lithographic projection apparatus having an optical element to which transducer elements may be attached for forming measurement signals or control signals without causing substantial EUV absorption.

This and other aspect are achieved according to the present invention in a lithographic apparatus including a radiation system configured to form a beam of radiation from radiation emitted by a radiation source; a support configured to hold a patterning device, the patterning device configured to be irradiated by the projection beam to pattern the projection beam; a substrate table configured to hold a substrate; and a projection system configured to image an irradiated portion of the patterning device onto a target portion of the substrate, wherein a reflector assembly is placed in the vicinity of the source or an image of the source, the reflector assembly comprising at least a first and a second reflector extending in the direction of an optical axis on which the source or an image of the source is located, the first and second reflector each having a reflective surface, a backing surface and an entry section, the entry sections being situated at respectively a first and a second distance from the optical axis, the first distance being larger than the second distance, rays deriving from the source and being cut off by the entry sections of the first and second reflectors and being reflected on the reflective surface of the first reflector defining zones of high and low radiation intensity between the reflectors, wherein a structure is placed on the backing surface of the second reflector at the position of the low intensity zone.

The reflector assembly functions as a collector of EUV radiation emitted by the source and directs a collimated beam of EUV radiation to further optical components along an optical axis to form the projection beam. Depending on the distance from the optical axis and the mutual distance between the two reflectors, a specific spatial segment of the emitted radiation, with the source as a center, is intercepted. Between the two reflectors the radiation propagates by being reflected at grazing angles of the reflective surface of the upper reflector. The space occupied by the reflected rays between the reflectors is defined by the rays emanating from the source and being intercepted by the entry parts of the reflectors. These rays bound zones having a generally angular cross-section of low radiation intensity in which the structural objects of the present invention are placed, preferably supported on the backing surface of the reflector closest to the optical axis.

By providing a structure in specific positions within the EUV beam, it was found that no substantial radiation absorption was introduced when the positions are selected to correspond to the low intensity regions.

In one embodiment, the reflectors extend at an angle to the optical axis. Each reflector may comprise at least two adjacent reflecting surfaces, the reflecting surfaces further from the source being placed at the smaller angle to the optical axis than the reflecting surfaces closer to the source. In this way, a grazing incidence collector may be constructed for generating a beam of EUV radiation propagating along the optical axis. Preferably, at least two reflectors are placed substantially coaxially and extend substantially rotationally symmetric around the optical axis. A grazing incidence collector of this (Wolter-) type is, for instance, described in German patent application DE 101 38 284.7, which is equivalent to U.S. Application Publication 2003/0095623 A1.

According to an exemplary embodiment, at least one nozzle is located in the low intensity zone for directing a fluid in the direction of the source. In this way, a buffer gas at relatively high pressure and low gas volume can be directed towards the source for removal of debris emitted by the source. With the system of the present invention, a high pressure and low gas load can be obtained. Preferably, the gas used is substantially transparent to EUV radiation and may be formed of, for example, He, Ar, $N_2$, $H_2$. Near the entry side of the reflector, a fluid removal unit, such as a pump, may be situated for removal of the gas and for preventing the gas from reaching the EUV source. The reflectors may be placed in a chamber having an opening comprising a pressure reduction member, such as a foil trap referred to earlier, the radiation source being placed in an adjacent source housing and emitting radiation through the pressure reduction member, the fluid removal unit being located in the chamber for removing fluid near the pressure reduction member, a second fluid removal unit being connected to the source housing.

According to another exemplary embodiment, the flow resistance of the reflector assembly is increased by placing a gas barrier member in the low intensity regions. Hereby the reflector assembly may form an effective vacuum separation between a source side and the optical components downstream of the optical axis, allowing removal of gas at a downstream side at relatively low pumping rates. The gas barrier may be formed by plate-shaped members that may be placed perpendicular to the backing surface of the reflector within the low intensity regions for increasing pressure resistance across the reflector along the optical axis. Pressure reduction may also be achieved by placing a barrier in the low intensity regions having a cross-section substantially corresponding to the boundaries of the low intensity zone. In this way, the gas flow rate through the collector can be reduced by approximately a factor of two.

In another exemplary embodiment, the structure within the low intensity zones comprises heat transfer device, such as fluid ducts or heat-conducting elements, such as copper wires. The ducts or copper wires may be guided away from the reflectors through the low intensity regions and be connected to a heat exchange element at the distance from the optical axis, such as an adjustable heat sink. By varying the diameter of the heat conductors, or by varying the heat conductor density in the direction of the optical axis, a differential heating or cooling along the optical axis may be achieved.

According to another exemplary embodiment of the present invention, transducers may be included within the low intensity regions for generating measurement signals, such as thermocouples, pressure sensors, or other structures, without affecting the EUV intensity of the generated beam.

According to another exemplary embodiment, mechanical or electrical-mechanical actuators for locally adjusting the reflector surface with respect to the optical axis.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

BRIEF DESCRIPTION OF THE DRAWINGS

Embodiments of the present invention will now be described, by way of example only, with reference to the accompanying schematic drawings in which corresponding reference symbols indicate corresponding parts, and in which:

FIG. 5 shows a perspective view on the grazing incidence collector of FIG. 3;

FIG. 6 shows a gas injection system incorporated in the grazing incidence collector of FIG. 3;

DETAILED DESCRIPTION

Figure 1:
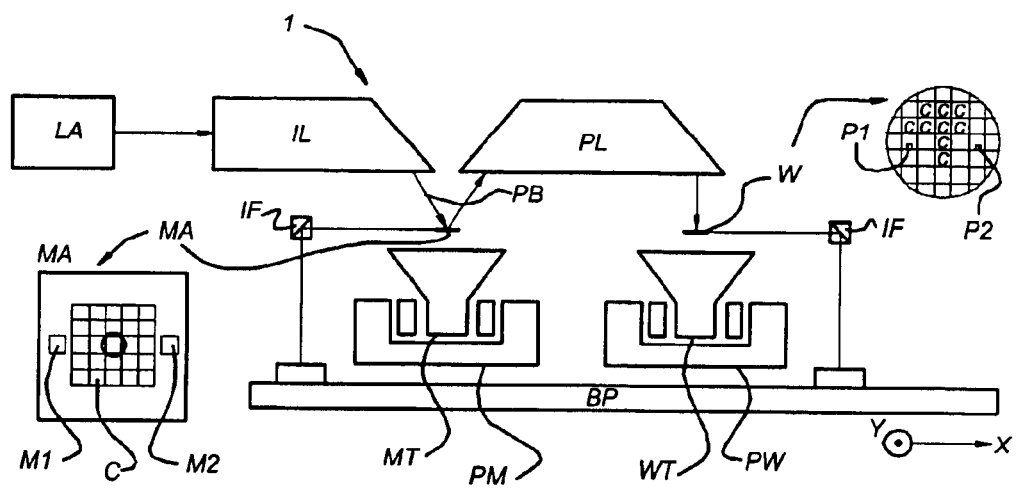
FIG. 1 schematically depicts a lithographic projection apparatus according to an embodiment of the present invention.

FIG. 1 schematically depicts a lithographic projection apparatus 1 according to an embodiment of the invention. The apparatus 1 includes a base plate BP. The apparatus may also include a radiation source LA (e.g. UV or EUV radiation, such as, for example, generated by an excimer laser operating at a wavelength of 248 nm, 193 nm or 157 nm, or by a laser-fired plasma source operating at 13.6 nm). A first object (mask) table MT is provided with a mask holder configured to hold a mask MA (e.g. a reticle), and is connected to a first positioning device PM that accurately positions the mask with respect to a projection system or lens PL. A second object (substrate) table WT is provided with a substrate holder configured to hold a substrate W (e.g. a resist-coated silicon wafer), and is connected to a second positioning device PW that accurately positions the substrate with respect to the projection system PL. The projection system or lens PL (e.g. a mirror group) is configured to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source LA (e.g. a discharge or laser-produced plasma source) produces radiation. This radiation is fed into an illumination system (illuminator) IL, either directly or after having traversed a conditioning device, such as a beam expander, for example. The illuminator IL may comprise an adjusting device configured to set the outer and/or inner radial extent (commonly referred to as σ-outer and σ-inner, respectively) of the intensity distribution in the beam PB. In addition, it will generally comprise various other components, such as an integrator and a condenser. In this way, the beam PB impinging on the mask MA has a desired uniformity and intensity distribution in its cross-section.

It should be noted with regard to FIG. 1 that the source LA may be within the housing of the lithographic projection apparatus, as is often the case when the source LA is a mercury lamp, for example, but that it may also be remote from the lithographic projection apparatus, the radiation which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer(s) IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g., the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
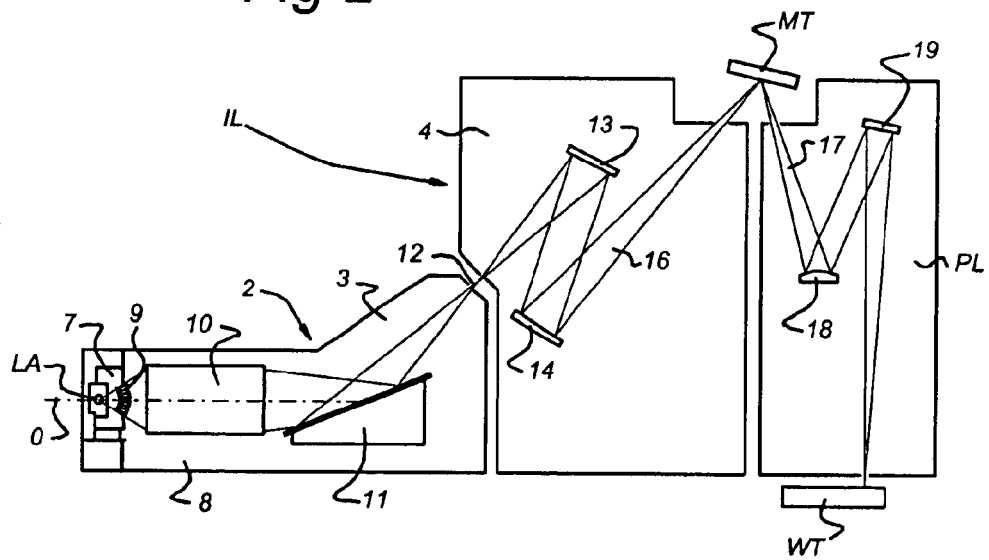
FIG. 2 shows a side view of an EUV illumination system and projection optics of a lithographic projection apparatus according FIG. 1.
Figure 3:
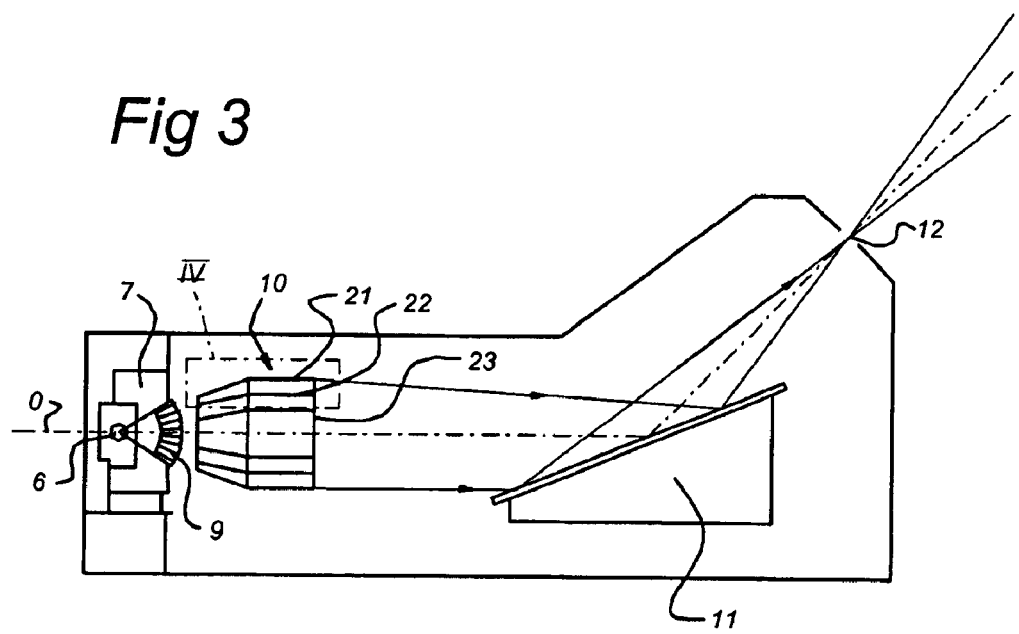
FIG. 3 shows a detail of the radiation source and grazing incidence collector of the present invention.

FIG. 2 shows the projection apparatus 1 including an illumination system (illuminator) IL, a source collector module or radiation unit 3, an illumination optics unit 4, and projection system (lens) PL. A radiation system 2 includes the source-collector module or radiation unit 3 and the illumination optics unit 4. The radiation unit 3 is provided with the radiation source LA which may be formed by a discharge plasma. Referring to FIG. 3, an EUV radiation source 6 may employ a gas or vapor, such as Xe gas or Li vapor in which a very hot plasma may be created to emit radiation in the EUV range of the electromagnetic spectrum. The very hot plasma is created by causing a partially ionized plasma of an electrical discharge to collapse onto the optical axis O. Partial pressures of 0.1 mbar of Xe, Li vapor or any other suitable gas or vapor may be required for efficient generation of the radiation. The radiation emitted by radiation source LA is passed from the source chamber 7 into collector chamber 8 via a gas barrier structure or "foil trap" 9. The gas barrier structure includes a channel structure such as, for example, described in U.S. Patent Application Publication 2002/0136939 A1 and U.S. Pat. No. 6,359,969.

The collector chamber 8 comprises a radiation collector 10, which according to the present invention is formed by a grazing incidence collector. Radiation passed by collector 10 is reflected off a grating spectral filter 11 to be focused in a virtual source point 12 at an aperture in the collector chamber 8. From chamber 8, the projection beam 16 is reflected in the illumination optics unit 4 via normal incidence reflectors 13, 14 onto a reticle or mask positioned on reticle or mask table MT. A patterned beam 17 is formed which is imaged in projection system PL via reflective elements 18, 19 onto wafer stage or substrate table WT. More elements than shown may generally be present in illumination optics unit 4 and projection system PL.

As can be seen in FIG. 3, the grazing incidence collector 10 comprises a number of nested reflector elements 21, 22, 23. A grazing incidence collector of this type is, for example, shown in German patent application DE 101 38 284.7.

Figure 4:
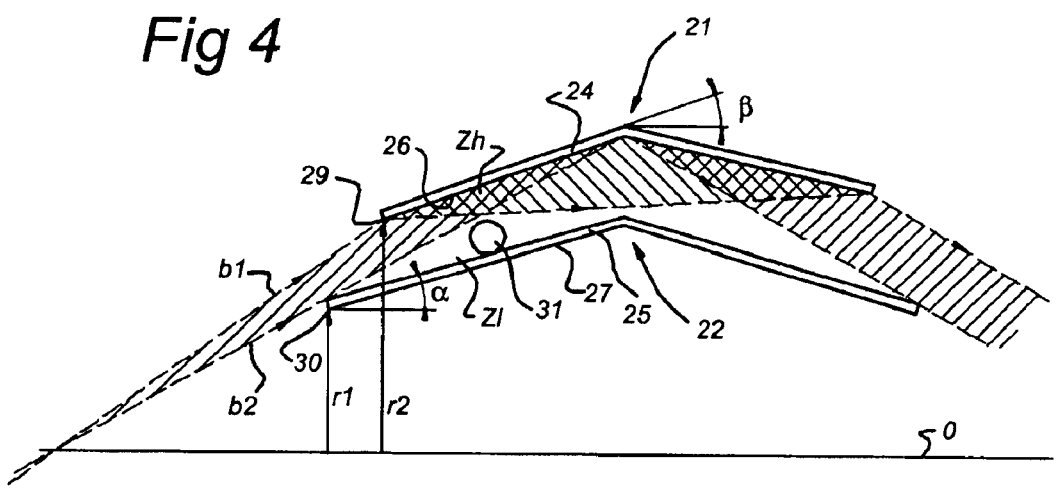
FIG. 4 shows a schematic view of the low radiation intensity zones in a grazing angle reflector assembly according to FIG. 3.

In the schematic overview of FIG. 4, an enlarged detail of the two (nested) adjacent reflectors 21, 22 of grazing incidence collector 10 of FIG. 3 are shown. Each reflector 21, 22 comprises a backing surface 24, 25 and a reflective surface 26, 27, respectively. Reflector 22 is located at a distance r1 from the optical axis, which is smaller than the distance r2 from the optical axis of reflector 21. The distances r1 and r2 may, for example, be 20 and 80 mm, respectively. The reflectors 21, 22 are under angles β and α, respectively, with the optical axis O. Rays of radiation b1 and b2 emitted from the source 6 and being reflected by entry sections 29, 30 of reflectors 21, 22 are reflected off reflective surface 26 of top reflector 21 and define zones zh of relatively high radiation intensity in the space between reflectors 21, 22 and zones zl of low, or zero, radiation intensity. Zones zl are of substantial triangular cross-section and are substantially free of radiation. This allows structures 31, such as explained in detail hereafter, to be attached to backing surface 25 of reflector 22 such as to be situated in the space between reflectors 21, 22 without causing substantial absorption of radiation.

It should be noted that the backing surfaces 24, 25 may be absorptive or, if so desired, reflective.

FIG. 5 shows a perspective view of a grazing incidence reflector 10 comprising eight coaxially nested reflectors. Each reflector 21, 22, for example, may comprise a first reflective surface 32 and second reflective surface 33 at an angle to reflective surface 32. As shown in FIG. 5, reflective surface 33 further from the source may be placed at a smaller angle to the optical axis O than the reflecting surface 32 closer to the source. Also, there may be a smooth transition from first reflective surface 32 to second reflective surface 33. Incoming ray b1 is reflected off reflective surface 32 as ray b'1 and reflected off reflective surface 33 as ray b"1. Incoming ray b2 is reflected off reflective surface 32 as reflected ray b'2. Rays b"1 and b'2 leaving the collector form an annular radiation beam situated around optical axis O. Rays b2 and b'1 form boundary rays of first low radiation intensity zone zl1, whereas reflected ray b'1 and b'2 form boundary rays of second low intensity zone zl2. Low radiation intensity zones zl1, zl2 are rotationally symmetric about optical axis O. The shaded area in FIG. 5 defines the high radiation intensity zones zh between reflectors 21, 22.

FIG. 6 shows an embodiment wherein the grazing incidence collector 10 in the low intensity zones zl1, zl2 is provided with gas injection members or tubes 35, 36. Gas injection members may be tubes placed on the backing surfaces of the reflectors which tubes comprise openings or nozzles 37, 38 configured to supply a gas in the space between adjacent reflectors in the direction of the source 6. The gas may be introduced into the tubes 35, 36 from a gas supply reservoir 39, via a fluid duct 40 and a pumping unit 41. The gas is, preferably, an EUV transparent gas, such as He, Ar, $N_2$, $H_2$, which is supplied at a gas flow rate between 0 and 1000 mbar·liters/second. The gas stream will be partly blocked by the foil trap 9 (there will always be some gas transmitted through the foil trap 9) and will travel along the surface thereof in the directions of the arrow as indicated, and may be removed via a gas removal duct 42 and exhaust pump 43. Particles and other impurities deriving from the source 6 and traveling through the foil trap 9 will be removed by the gas stream via gas removal duct 42 without being able to travel through grazing incidence collector 10 into the illumination optics unit 4. Hence, damage to illumination optics can be reduced. By using a gas flow at a rate between 0 and 1000 mbar·liters/second, removal can be achieved while maintaining the gas flow into the source 6 at a low level. By being able to place the gas injection members 35, 36 in very close proximity to the ray paths of the radiation transmitted through grazing incidence collector 10, without substantially blocking EUV transmission and in the main propagation direction of the debris, the gas flow can be directed substantially in the directions of the EUV photons without blocking these. A second gas removal duct 44 may be placed within source chamber 7 for removing any residual gas flow deriving from gas injection members 35, 36 at the back of foil trap 9 via an exhaust pump 45.

Figure 7:
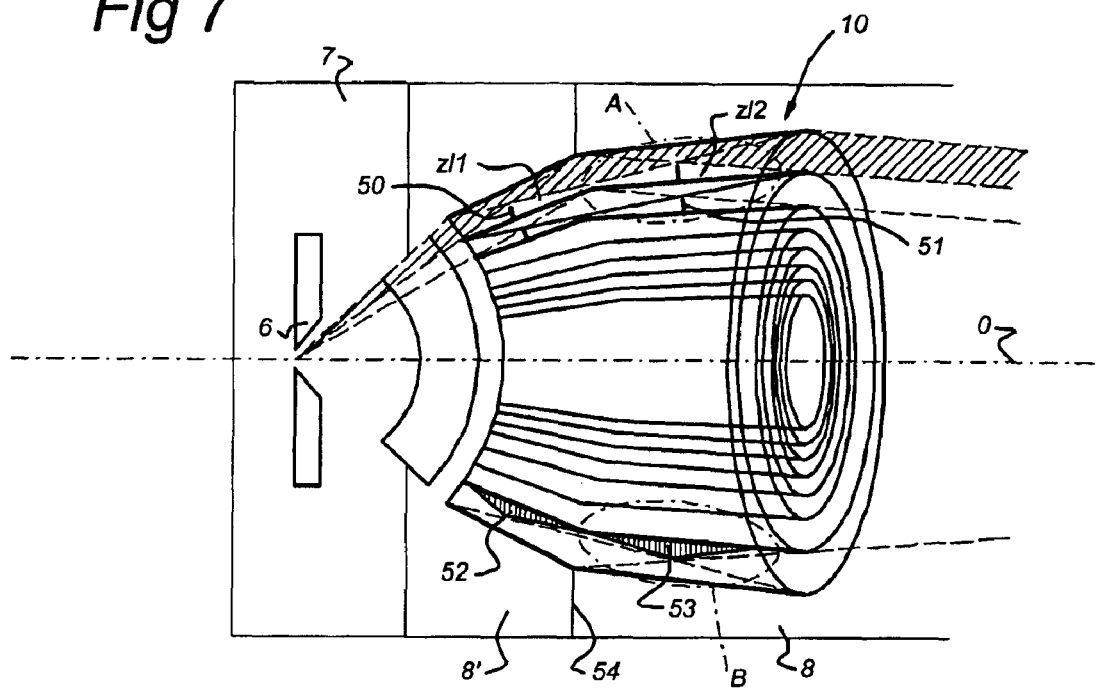
FIGS. 7–7b show a gas barrier system associated with the grazing incidence collector of FIG. 3.
Figure 7A:
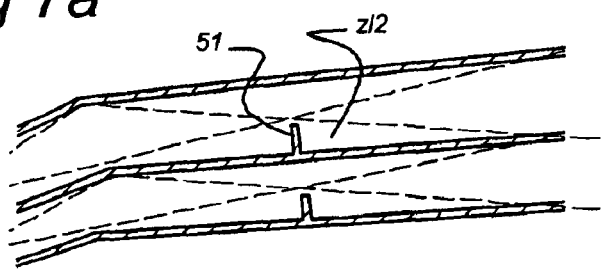
Figure 7B:
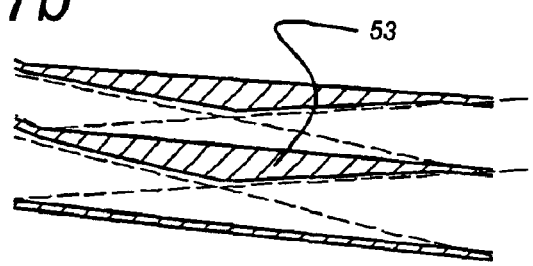

FIGS. 7–7b shows an embodiment of grazing incidence collector 10 in which gas barrier members 50, 51 or 52, 53 are connected to the backing surface of the inner reflectors in low radiation intensity zones zl1, zl2. For the collector parts situated above the optical axis, the gas barrier members 50, 51 are indicated to be formed of annular, plate-shaped members substantially perpendicular to the reflectors and extending to substantially halfway the distance between adjacent reflectors, i.e. to the top of low radiation intensity zones zl1, zl2. In the lower parts of grazing incidence collector 10, the gas barrier members 52, 53 are shown to be comprised of three dimensional ring-shaped gas barrier members with triangular cross-sections for providing even more effective blocking of a gas flow along the reflectors towards the projection optics. Using this construction, a high pressure difference between source chamber 7 and illuminator optics chamber 8' can be effected, the pressure in source chamber 7 being, for example 0.1 mbar, whereas pressure in illuminator optics chamber 8' is 0.001 mbar. A partitioning wall 54 sealingly closes off chamber 8' from collector chamber 8 such that a pressure difference between chambers 8' and 8, in view of the barrier members 50–53 may be increased. For instance, for proper EUV transmission a xenon pressure lower than $10^{-3}$ mbar in the illuminator optics chamber 8' is desirable. A xenon pressure in this range leads to a transmission higher than 94% for 13.5 nm radiation.

Figure 8:
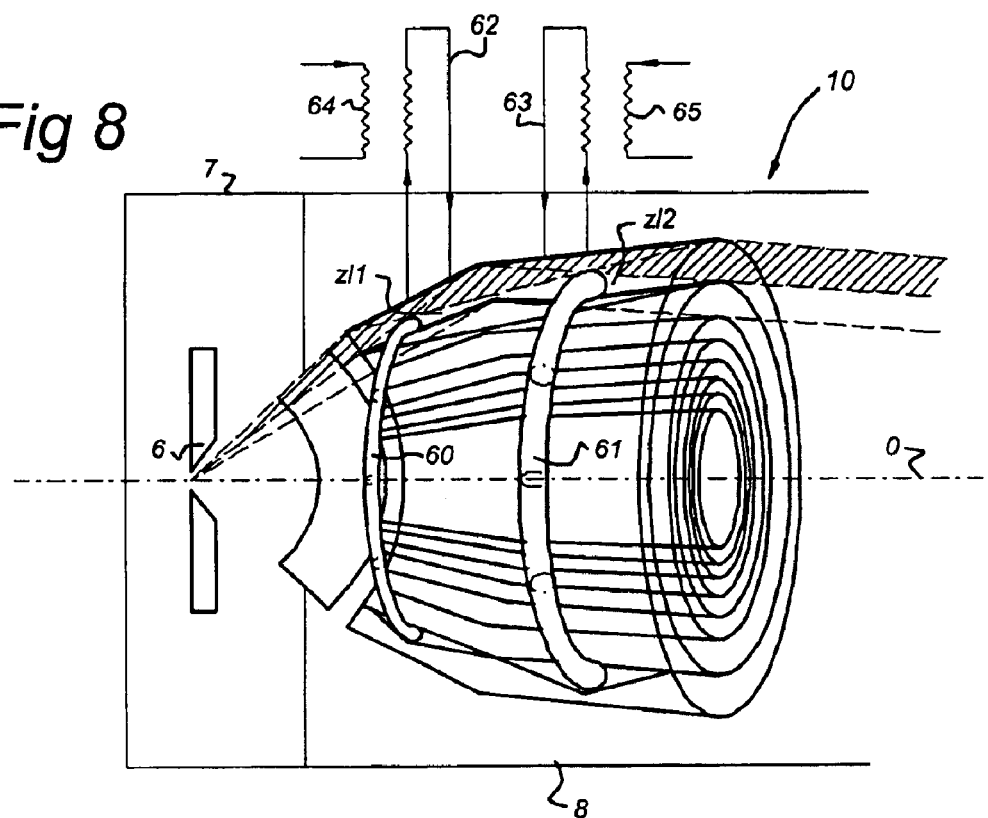
FIG. 8 shows cooling ducts associated with the grazing incidence collector of FIG. 3.

FIG. 8 shows a grazing incidence collector 10 in which in the zones of low radiation intensity zl1, zl2 coaxial with the optical axis, cooling tubes 60, 61 are placed supported on the backing surface of the reflectors. Within cooling tubes 60, 61 a cooling fluid is circulated in a heat exchange loop 62, 63 placed outside the collector optics chamber 8. After passing heat exchangers 64, 65 the cooling fluid is recirculated. Typically, more than 250 watts of radiation generated by the source 6 will be absorbed by the grazing incidence collector 10. Temperatures of the reflectors of grazing incidence collector 10 near the source 6 may rise to over 100–300° C. at a position near the radiation source 6 and to temperatures ranging from 50–150° C. at a position of the collector 10 at a distance from the source 6. By cooling the collector 10, temperatures may be reduced. By proper cooling, the temperature of the collector can reach the ambient temperature level. As a cooling fluid, water may be used or a liquid metal such as Na.

Figure 9:
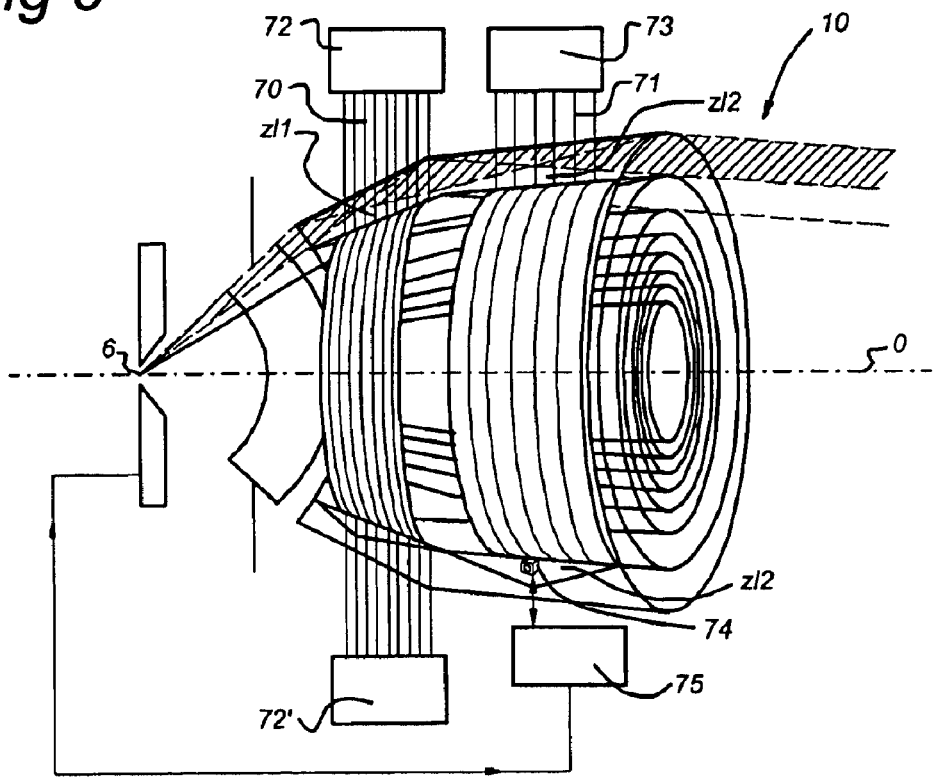
FIG. 9 shows conductive elements and a transducer and/or actuator associated with the grazing incidence collector of FIG. 3.

Referring to FIG. 9 a number of cooling wires 70, 71 are placed on the backing surface of the reflectors. The wires may for instance be formed by copper wires. Near the source 6, the cooling capacities of the wires 70, 71 may be relatively large by placing the wires in close proximity along the optical axis O. At positions further along the optical axis, the cooling wires 71 may be spaced apart further to reduce the cooling properties in order to generate a cooling gradient along the optical axis. Alternatively, the diameters of the cooling wires 70, 71 may vary. The end of wires 70, 71 may be connected to heat sinks 72, 72', and 73, respectively. The heat sinks may be varied in cooling capacity in order to regulate the temperature of the reflectors in dependence on the power of the source. As shown in FIG. 9, a measuring unit 74, for example a transducer, may be placed in zone of low radiation intensity zl2 for supplying a measurement signal to a computing unit 75. Measuring unit 74 may, for example, be a thermocouple, such that, for example, control of the radiation source 6, dependent on the temperature, may occur via computing unit 75. Alternatively, a displacement unit, or actuator, can be employed, such as a piezo-electric crystal, for adjusting the position of the reflectors via computing unit 75, for example, in dependence on the power of the source 6 or the temperature of the reflectors.

Figure 10:
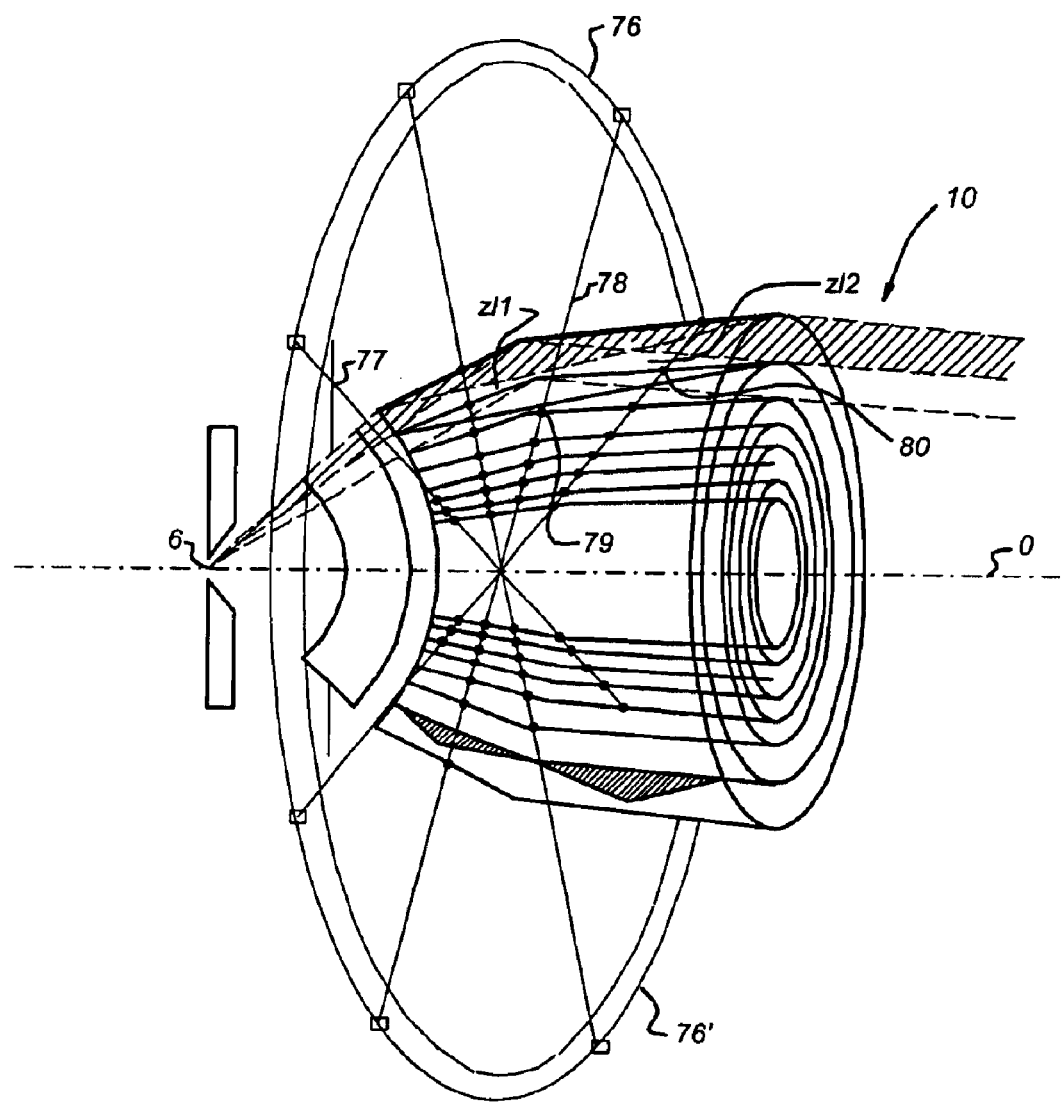
FIG. 10 shows a support frame for the components of the grazing incidence collector of FIG. 3 according to the present invention.

FIG. 10 shows collector support members 76, 76' carrying support rods 77, 78 extending through the zones of low radiation intensity zl1, zl2. Individual reflectors are supported on the rod 77, 78 and are fixed in an accurately defined mutual relationship. The collectors are attached to the support rods 77, 78 at attachment points 79, 80 by appropriate attachment techniques such as welding or brazing. The reflectors together with the support rods 77, 78 form, when viewed parallel to the optical axis O, a "spider wheel" structure. This structure creates a shade in the rest of the system (downstream of the structure). Upstream of the "spider wheel" structure, objects can be placed in the (virtual) shade of the structure. These object will be radiated by the EUV beam. However, this will not result in less light downstream of the structure.

In the collector 10 there are low-intensity zones, and additional zones which correspond to the upstream shade of the structure. Both zones can be used for the purposes as described above. Since the upstream shades of the structure extend outside the collector, they can be used for gas inlet, cable input/output and additional support structure for transducers, gas nozzles, pumping restrictions and cooling structures.

While specific embodiments of the invention have been described above, it will be appreciated that the invention may be practiced otherwise then as described. The description is not intended to limit the invention.

What is claimed is:

1. A lithographic projection apparatus, comprising:
   a radiation system configured to form a beam of radiation from radiation emitted by a radiation source;
   a support configured to hold a patterning device which is to be irradiated by the beam of radiation, the patterning device configured to pattern the beam of radiation;
   a substrate table configured to hold a substrate; and
   a projection system configured to image an irradiated portion of the patterning device onto a target portion of the substrate, the radiation system further comprising:
   an aperture spaced from an optical axis;
   a reflector placed behind the aperture when seen from the source, the reflector creating a low radiation intensity zone behind the aperture; and
   a structure placed in the low radiation intensity zone.

2. A lithographic projection apparatus, comprising:
   a radiation system configured to form a beam of radiation from radiation emitted by a radiation source;
   a support configured to hold a patterning device which is to be irradiated by the beam of radiation, the patterning device configured to pattern the beam of radiation,
   a substrate table configured to hold a substrate; and
   a projection system configured to image an irradiated portion of the patterning device onto a target portion of the substrate, the radiation system comprising:
   a reflector assembly placed in the vicinity of the source or an image of the source, the reflector assembly comprising a first and a second reflector extending in the direction of an optical axis on which the source or an image of the source is located, the first and second reflector each having a reflective surface, a backing surface and an entry section, the entry sections being situated at respectively a first and a second distance from the optical axis, the first distance being larger than the second distance, rays deriving from the source and intersecting the entry sections of the first and second reflectors being reflected on the reflective surface of the first reflector and defining a high radiation intensity zone and a low radiation intensity zone between the reflectors, wherein a structure is placed at a position of the low intensity zone.

3. A lithographic projection apparatus according to claim 2, wherein the first and second reflectors extend at first and second angles, respectively, to the optical axis.

4. A lithographic projection apparatus according to claim 3, wherein each reflector comprises two adjacent reflecting surfaces, the reflecting surface further from the source being placed at a smaller angle to the optical axis than the reflecting surface that is closer to the source.

5. A lithographic projection apparatus according to claim 2, wherein the two reflectors are substantially coaxial and extend substantially rotationally symmetrically around the optical axis.

6. A lithographic projection apparatus according to claim 2, wherein the structure in the low intensity zone comprises a fluid supply device configured to direct a fluid in the direction of the source.

7. A lithographic projection apparatus according to claim 6, wherein the fluid is substantially transparent to EUV radiation with a wavelength between 5–20 nm.

8. A lithographic projection apparatus according to claim 6, wherein a fluid removal unit is located near the entry sections of the reflectors.

9. A lithographic projection apparatus according to claim 8, wherein the reflectors are placed in a chamber having an opening comprising a pressure reduction member, the radiation source is placed in an adjacent source housing and emits radiation through the pressure reduction member, the fluid removal unit is associated with the chamber for removing fluid near the pressure reduction member, and a second fluid removal unit is associated with the source housing.

10. A lithographic projection apparatus according to claim 6, wherein a gas barrier member is placed in the low radiation intensity zone to increase a fluid resistance of fluid passing between the reflectors.

11. A lithographic projection apparatus according to claim 10, wherein the gas barrier member substantially occupies the low radiation intensity zone.

12. A lithographic projection apparatus according to claim 10, wherein the gas barrier member comprises a substantially plate-shaped member directed transverse to the backing surface of the second reflector.

13. A lithographic projection apparatus according to claim 2, wherein the structure comprises a heat transfer device.

14. A lithographic projection apparatus according to claim 13, wherein the heat transfer device comprise fluid ducts extending in the low radiation intensity zones.

15. A lithographic projection apparatus according to claim 13, wherein the heat transfer device comprise conducting elements.

16. A lithographic projection apparatus according to claim 13, wherein a heat transfer capacity of the heat transfer device varies along the optical axis.

17. A lithographic projection apparatus according to claim 13, wherein the heat transfer device is connected to an adjustable heat sink located at a distance from the reflectors.

18. A lithographic projection apparatus according to any of the preceding claim 2, wherein the structure comprises radial support members configured to support the reflectors extending in the low radiation intensity zone, in a radial direction.

19. A lithographic projection apparatus according to claim 2, wherein the structure comprises a transducer configured to form a signal and connected to a signal lead configured to supply the signal to a processing member located at a distance from the reflectors.

20. A lithographic projection apparatus according to claim 2, wherein the structure is on the backing surface of the second reflector.

21. A reflector assembly for use in a lithographic projection apparatus, the reflector assembly comprising:

a first and a second reflector extending in a direction of an optical axis, the first and second reflector each having a reflective surface, a backing surface and an entry section at respectively a first and a second distance from the optical axis, the first distance being larger than the second distance, rays deriving from a point on the optical axis being cut off by the entry sections of the first and second reflectors and being reflected on the reflective surface of the first reflector and defining a high radiation intensity zone and a low radiation intensity zone between the reflectors, wherein a structure extends perpendicular to the backing surface of the second reflector at a position of the low intensity zone.

22. A reflector assembly according to claim 21, wherein the structure in the low intensity zone comprises:

a nozzle for directing a fluid in the direction of the input sections of the reflectors;

a gas barrier member for increasing a fluid resistance of fluid passing between the reflectors;

a heat transfer device;

a radial support member configured to support the reflectors extending in the low radiation intensity zone; or a transducer configured to form a signal and connected to a signal lead configured to supply the signal to a processing member located at a distance from the reflectors.

23. A method of manufacturing an integrated structure by a lithographic process, the method comprising:

providing a radiation system configured to form a beam of radiation from radiation emitted by a radiation source;

providing a support configured to hold a patterning device, the patterning device to be irradiated by the beam to pattern the projection beam;

providing a substrate table configured to hold a substrate; and providing a projection system configured to image an irradiated portion of the patterning device onto a target portion of the substrate, wherein an aperture is placed at a distance from an optical axis, the radiation beam being irradiated on a reflector placed behind the aperture when seen from the source; and placing a structure in a low radiation intensity zone behind the aperture.

\* \* \* \* \*